United States Patent [19]

Beinglass et al.

[11] Patent Number: 4,975,385
[45] Date of Patent: Dec. 4, 1990

[54] METHOD OF CONSTRUCTING LIGHTLY DOPED DRAIN (LDD) INTEGRATED CIRCUIT STRUCTURE

[75] Inventors: Israel Beinglass, Sunnyvale; John Borland, San Jose, both of Calif.

[73] Assignee: Applied Materials, Inc., Santa Clara, Calif.

[21] Appl. No.: 505,745

[22] Filed: Apr. 6, 1990

[51] Int. Cl.[5] .................. H01L 21/263; H01L 21/205
[52] U.S. Cl. ........................ 437/44; 437/41; 437/30; 437/29; 437/233; 148/DIG. 122
[58] Field of Search .................. 437/27, 28, 29, 30, 437/40, 41, 44, 233, 149, 154, 89, 90; 357/23.3, 23.4, 59 G; 148/DIG. 122

[56] References Cited

U.S. PATENT DOCUMENTS

| | | | |
|---|---|---|---|
| 4,691,433 | 9/1987 | Pimbley et al. | 437/44 |
| 4,722,909 | 2/1988 | Parrillo et al. | 437/44 |
| 4,727,038 | 2/1988 | Watabe et al. | 437/44 |
| 4,758,531 | 7/1988 | Beyer et al. | 437/90 |
| 4,786,615 | 11/1988 | Liaw et al. | 437/89 |
| 4,818,713 | 4/1989 | Feygenson | 148/DIG. 10 |
| 4,873,205 | 10/1989 | Critchlow et al. | 437/90 |
| 4,925,807 | 5/1990 | Yoshikawa | 437/44 |

FOREIGN PATENT DOCUMENTS

0181378  7/1988  Japan ................................. 437/233

OTHER PUBLICATIONS

Author Unknown, "Selective Silicon Pitaxial Growth", IBM Technical Disclosure Bulletin, vol. 31, No. 2, Jul. 1988, p. 432.

Kamins, "Chemically Vapor Deposited Polycrystalline-Silicon Films", IEEE Trans. on Parts, Hybrids, and Packaging, Dec. 1974, pp. 221-229.

Bassous, E. et al., "Self-Aligned Polysilicon Gate MOSFETS with Tailored Source and Drain Profiles", IBM Technical Disclosure Bulletin, vol. 22, No. 11, Apr., 1980, pp. 5146-5147.

Parillo, L. C. et al., "A Versatile, High-Performance, Double-Level-Poly Double-Level-Metal, 1.2-Micron CMOS Technology", IEDM, 1986, pp. 244-247.

Huang, Tiao-Yuan et al., "A Novel Submicron LDD Transistor with Inverse-T Gate Structure", IEDM, 1986, pp. 742-745.

Izawa, Ryuichi et al., "Impact of the Gate-Drain Overlapped Device (GOLD) for Deep Submicrometer VLSI", IEEE Transactions on Electron Devices, vol. 35, No. 12, Dec. 1988, pp. 2088-2093.

Pfiester, J. R. et al., "A Self-Aligned LDD/Channel Implanted ITLDD Process with Selectivity-Deposited Poly Gates for CMOS VLSI", IEDM, 1989, pp. 769-772.

Borland, John O. et al., "Selective Silicon Deposition for the Megabit Age", Solid State Technology, Jan., 1990, pp. 73-78.

Chen, Ih-Chin et al., "Simple Gate-to-Drain Overlapped MOSFET's Using Poly Spacers for High Immunity to Channel Hot-Electron Degradation", IEEE Electron Device Letters, vol. 11, No. 2, Feb., 1990, pp. 78-81.

Primary Examiner—Olik Chaudhuri
Assistant Examiner—M. Wilczewski
Attorney, Agent, or Firm—Paul L. Hickman; John P. Taylor

[57] ABSTRACT

An improved method is disclosed for forming one or more N− LDD regions in an integrated circuit structure wherein there is no offset between the gate electrode and the source and drain regions in the resulting structure which comprises the steps of: forming a polysilicon gate electrode over a semiconductor wafer substrate, N− doping the substrate to form one or more N− LDD regions, selectively depositing polysilicon on the polysilicon sidewalls of the gate electrode, and then N+ doping the substrate to form N+ source and drain regions in the substrate using the selectively deposited polysilicon as a mask over the N− LDD regions previously formed in the substrate.

19 Claims, 4 Drawing Sheets

METHOD OF CONSTRUCTING LIGHTLY DOPED DRAIN (LDD) INTEGRATED CIRCUIT STRUCTURE

BACKGROUND OF THE INVENTION

1. Field of the Invention

This invention relates to an improved method for forming lightly doped drain (LDD) regions in integrated circuit structures.

2. Description of the Related Art

The use of lightly doped drain (LDD) regions in VLSI MOS integrated circuit structures is well known to overcome electric field effects near the drain region which can cause short channel effects or punchthrough.

The formation of such a lightly doped drain region (LDD) between the channel and the more heavily and deeper doped conventional drain region spreads out the electric field which mitigates short-channel effects, reduces hot-carrier generation, and increases the junction breakdown voltage.

Oxide spacers, formed on the sidewalls of the gate electrode, have been utilized in the formation of such LDD regions in the substrate. For example, Bassous et al., in an article entitled "Self Aligned Polysilicon Gate MOSFETs with Tailored Source and Drain Profiles", proposed thermally oxidizing a polysilicon gate electrode and the silicon substrate followed by reactive ion etching to form oxide sidewalls or spacers on the side of the polysilicon gate electrode. Source and drain regions were then formed in the substrate by an N+ implantation with the oxide spacers shielding the regions in the substrate laterally adjacent the channel region in the substrate beneath the gate electrode. The oxide spacers were then stripped followed by an N− implant to form N− or lightly doped source and drain regions in the substrate between the N+ source and drain regions and the channel beneath the gate electrode.

Parillo et al., in an article entitled "A Versatile, High-Performance, Double-Level-Poly Double-Level-Metal, 1.2-Micron CMOS Technology", describe constructing MOS devices with LDD regions using, instead of the oxide spacer, a disposable polysilicon spacer which is formed on the sidewall of the gate electrode following which an N+ implant to form source and drain regions is performed. The polysilicon spacers are then removed and an N-implant is made resulting in N− LDD regions in the substrate between the N+ regions and the channel formed in the substrate beneath the gate electrode.

However, stripping such disposable polysilicon spacers from the structure could, in itself, cause further problems. Since they are said to be disposable, the polysilicon spacers presumably are separated from the polysilicon gate electrode by an oxide layer. If the quality of this oxide was not perfect, etchant used to remove the disposable polysilicon spacer might penetrate the oxide to attack the polysilicon gate. In addition, if there were pinholes in the oxide layer, which is formed over the polysilicon gate prior to deposition of the conformal layer of polysilicon used to form the polysilicon spacers, the two polysilicon layers may coalesce and subsequent RIE etching to form the spacer could etch through these areas instead of stopping on the oxide layer.

More recently, it has been recognized that the formation of LDD regions which results in an offset between the N+ or P+ source and drain regions and the gate electrode results in a significant reduction in current-drive capability and faster degradation rates. To remedy this, it has been proposed to laterally extend a thin portion of the polysilicon gate electrode, i.e., by forming the gate electrode in the shape of an inverted T.

In "A Novel Submicron LDD Transistor With Inverse-T Gate Structure", Huang et al. describe the formation of an MOS transistor with an LDD region wherein the polysilicon gate edge extends over the LDD region to the edge of the heavier doped drain region. The device is formed by not fully etching away the polysilicon layer used to form the gate electrode, leaving a thin polysilicon layer of about 50–100 nanometers. The substrate is then doped through this thin polysilicon layer to form the LDD regions. Conventional oxide spacers are then formed on the sides of the raised polysilicon gate after which the remainder of the thin polysilicon layer not beneath the oxide spacers is removed, leaving a T shaped polysilicon gate electrode. The conventional source/drain doping is then carried out with the oxide spacers shielding the previously formed LD regions. The thin polysilicon portions beneath the oxide spacers next to the gate electrode then act as extensions of the gate electrode to the conventional source and drain regions.

In "Impact of the Gate-Drain Overlapped Device (GOLD) for Deep Submicrometer VLSI", Izawa et al. describe the formation of an MOS device using a first thin layer of polysilicon over which an oxide etch stop layer is deposited before applying a second polysilicon layer. The upper polysilicon layer is then etched down to the oxide etch stop to form the gate electrode following which the substrate is lightly doped through the lower polysilicon layer to form an N− region in self-alignment with the gate. Oxide sidewall spacers on the sidewall of the gate electrode are then formed before doping with arsenic to form the N+ source and drain regions outside the oxide spacers.

In "A Self-Aligned LDD/Channel Implanted ITLDD Process With Selectively-Deposited Poly Gates for CMOS VLSI", Pfiester et al. describe formation of MOS transistors with LDD regions formed by first forming a thin polysilicon layer over a gate oxide layer and then depositing a thick LTO gate masking layer over the polysilicon layer. Windows are then opened in the LTO layer and polysilicon is selectively deposited to form the gate electrodes. The LTO layer is then removed leaving a continuous thin poly shelf with thicker poly B regions only over MOS channel regions. Selective N− and P− implantation is then carried out to form the LDD regions. Oxide sidewall spacers are then formed followed by removal of remaining exposed portions of the poly shelf to leave a T shaped polysilicon gate electrode. The structure is then subject to N+ and P+ implantation.

While the formation of such T-shaped polysilicon gate electrodes does permit formation of the desirable LDD regions in integrated circuit structures without forming offsets between the gate electrode and the source and drain regions of the active device, formation of the thin polysilicon lateral extension portions of the gate electrode is difficult from a production standpoint.

Chen et al. in an article entitled "Simple Gate-to-Drain Overlapped MOSFET's Using Poly Spacers for High Immunity to Channel Hot-Electron Degradation", suggests the formation of polysilicon spacers formed similarly to the prior art formation of oxide spacers, i.e., by depositing a layer of polysilicon followed by etching to leave a polysilicon spacer on the side of the gate electrode.

However, using this method still requires separate steps to deposit the polysilicon layer and then to etch the polysilicon layer to form the spacers. It would, therefore, be desirable to provide an improved and simplified method for forming such LDD regions in the substrate of an integrated circuit structure, without creating undesirable offsets between the gate electrode and the source and drain regions, by forming a gate electrode structure with polysilicon formed over LDD regions in the wafer substrate which eliminates difficult to produce T-shaped gate electrodes, as well as the need for a separate etching step after deposition of the polysilicon over the LDD regions.

SUMMARY OF THE INVENTION

It is, therefore, an object of this invention to provide an improved method for forming one or more LDD regions in an integrated circuit structure.

It is another object of this invention to provide an improved method for forming one or more LDD regions in an integrated circuit structure wherein there is no offset between the gate electrode and the source and drain regions in the resulting structure.

It is yet another object of this invention to provide an improved method for forming one or more LDD regions in the substrate of an integrated circuit structure by forming a polysilicon gate electrode, doping the substrate to form the LDD regions, selectively depositing polysilicon on the polysilicon sidewalls of the gate electrode, and then doping the substrate to form the source and drain regions using the newly deposited polysilicon as a mask over the LDD regions.

It is still another object of this invention to provide an improved integrated circuit structure comprising LDD regions formed in an integrated circuit structure substrate beneath a polysilicon gate electrode, by first forming a polysilicon gate electrode, doping the substrate to form the LDD regions, selectively depositing polysilicon on the polysilicon sidewalls of the gate electrode, and then doping the substrate to form the source and drain regions using the newly deposited polysilicon as a mask over the LDD regions. These and other objects of the invention will be apparent from the following description and accompanying drawings.

DETAILED DESCRIPTION OF THE INVENTION

Figure 1:
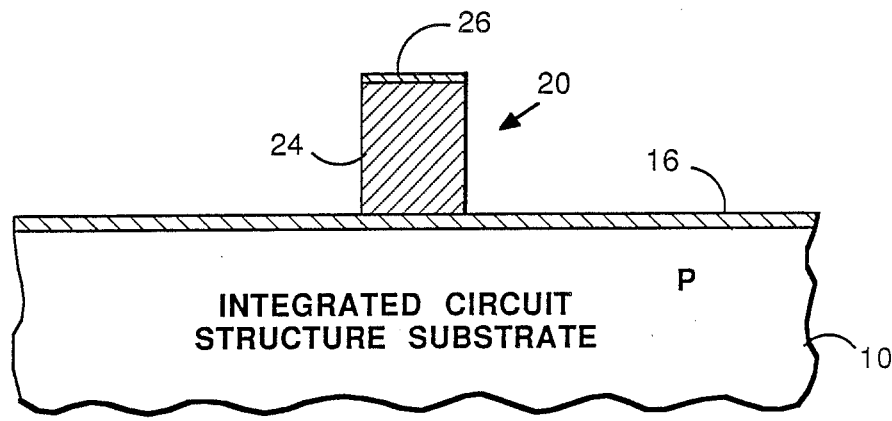
FIG. 1 is a fragmentary vertical cross-sectional view of a semiconductor wafer having a polysilicon gate electrode structure formed thereon.

Referring to FIG. 1, an integrated circuit structure substrate 10 is shown with a gate oxide layer 16 already formed over the surface of substrate 10. A polysilicon gate electrode 20 is shown formed over gate oxide layer 16 by previous patterning of a polysilicon layer and an oxide layer formed over the polysilicon layer leaving raised polysilicon segment 24 and oxide cap 26 thereon which comprise polysilicon gate electrode 20 shown in FIG. 1.

In FIG. 1, substrate 10 is shown as a P type semiconductor material in which, by way of illustration and not of limitation, an NMOS device will be formed having N— doped LDD regions constructed in accordance with the invention. It will be readily appreciated by those skilled in the art that such an NMOS device could, instead, be constructed in a P well in an N type substrate, using the teachings of the invention.

Figure 2:
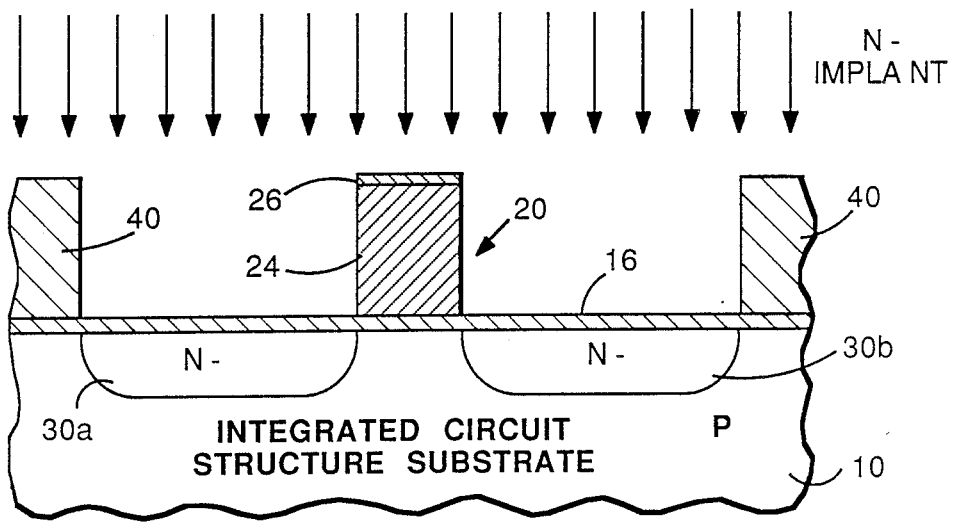
FIG. 2 is a fragmentary vertical cross-sectional view of the structure of FIG. 1 showing N— LDD regions being formed in the wafer substrate by implanting the substrate with an N— dopant.

Still referring to the drawings, LDD regions 30a and 30b are then formed in substrate 10 by an N-implantation of a dopant such as phosphorus into P type substrate 10, as shown in FIG. 2. The N-dopant may be implanted into substrate 10 at an energy level of from about 60 KeV to about 80 KeV and at a dosage level ranging from about $10^{13}$ to about $10^{14}$ atoms/cm$^2$. While other Group V dopants, such as arsenic, could be used as the N— dopant, the use of phosphorus is preferred because the smaller molecule will diffuse more easily down into the substrate to the desired depth of from about 0.2 micrometers (microns) to about 0.4 micrometers.

As shown in FIG. 2, the remainder of the integrated circuit structure may be optionally masked or shielded during the implantation step using an oxide or photoresist mask such as the illustrated mask 40 to avoid the doping of, for example, bipolar or PMOS active devices also formed or to be formed in substrate 10.

Following the N— implantation step, the structure may be annealed at this time, if desired, at temperature ranging from about 850° C. to about 950° C. for a time period ranging from about 15 minutes to about 30 minutes using a conventional anneal, or at a temperature of from about 950° C. to about 1050° C. for from about 10 seconds to about 30 seconds using a rapid anneal technique, to diffuse the N— dopant to the desired depth in substrate 10.

While the N— dopant may be annealed at this point to diffuse the dopant further into the substrate, preferably, the structure is preferably annealed to diffuse the N— dopant after the subsequent N+ implantation so that both the N+dopant and the N—dopant may be diffused into the substrate at the same time.

Figure 3:
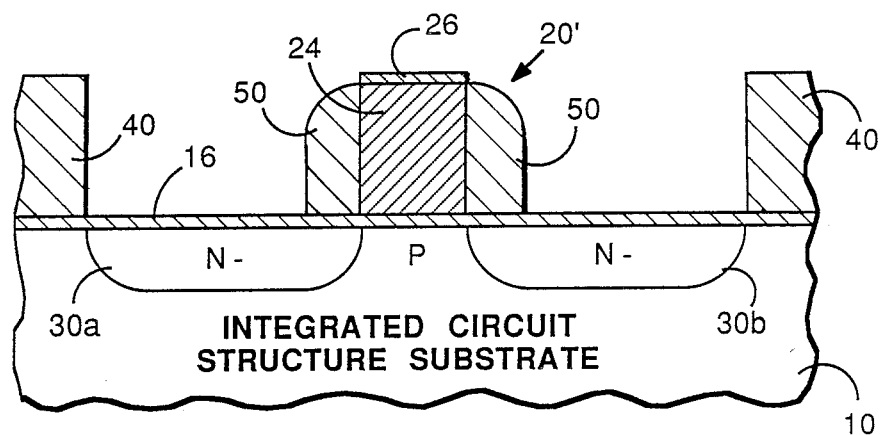
FIG. 3 is a fragmentary vertical cross-sectional view showing polysilicon portions selectively deposited on the sidewalls of the polysilicon gate electrode structure shown in FIGS. 1 and 2.
Figure 5:
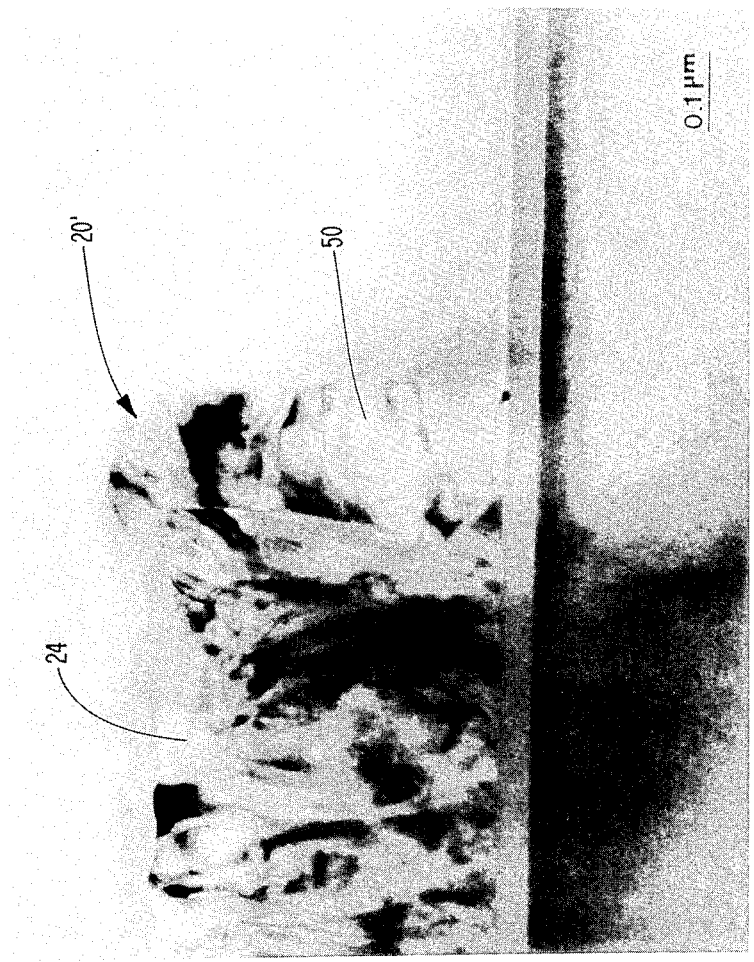
FIG. 5 is a photomicrographic view showing the polysilicon gate electrode formed over a gate oxide layer on a semiconductor wafer substrate with polysilicon selectively grown on the sidewall of the gate electrode.
Figure 6:
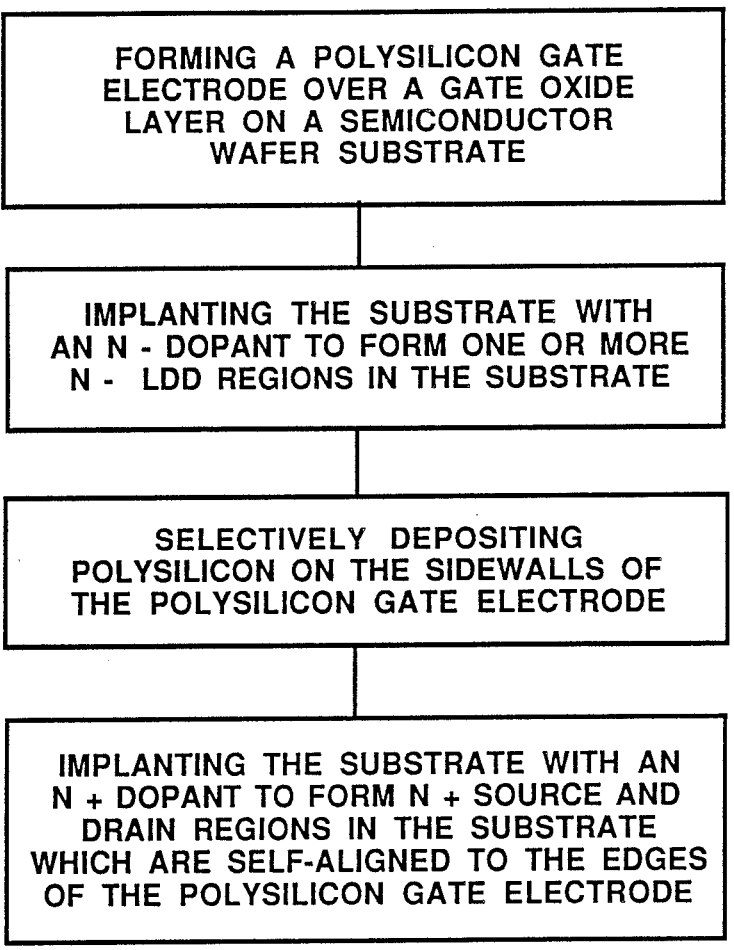
FIG. 6 is a flow sheet illustrating the process of the invention.

After the N— implantation step and optional annealing step, polysilicon sidewall segments 50 are selectively deposited on the exposed sidewalls of polysilicon gate electrode 20 using a selective silicon deposit process which comprises depositing polysilicon over the structure in a CVD chamber at a pressure of from about 10 Torr to about 760 Torr, using a halogen-containing source of silicon such as, for example, SiH$_2$Cl$_2$, SiHCl$_3$, or SiCl$_4$, which is flowed into the CVD vacuum chamber at a flow rate of from about 100 standard cubic centimeters/ minute (sccm) to about 200 sccm until a polysilicon deposit 50 having a lateral thickness or width of from about 0.05 micrometers to about 0.2 micrometers has deposited on the sidewalls of polysilicon segment 24 of gate electrode 20 (as shown in the photomicrograph of FIG. 5) to form a wider polysilicon gate electrode generally indicated as 20' in FIG. 3.

After the selective deposition of polysilicon sidewalls segments 50 on the sidewalls of polysilicon gate electrode 20, substrate 10 is implanted with an N+ dopant such as arsenic at an energy level of from about 60 to about 80 KeV and a concentration ranging from about $2 \times 10^{15}$ to about $5 \times 10^{15}$ atoms/cm$^2$ to form the source and drain regions in substrate 10.

Following the N+ implantation step, the structure may be annealed at a temperature ranging from about 850° C. to about 950° C. for a time period ranging from about 15 minutes to 30 minutes using either a conventional anneal or a rapid anneal technique to diffuse the N+ dopant to a depth of from about 0.1 to about 0.3 micrometers in substrate 10.

It should be noted at this point that phosphorus may be used instead of arsenic as the N+ dopant. However, in particular when a single annealing step is used to diffuse both the N− dopant and the N+ dopant to the desired depth in substrate 10, it is preferable that the N− dopant be a smaller and more mobile atom, such as phosphorus, and the N+ dopant be a less mobile atom, such as arsenic, to permit a deeper diffusion of the N− dopant into substrate 10 during such a single diffusion step.

Figure 4:
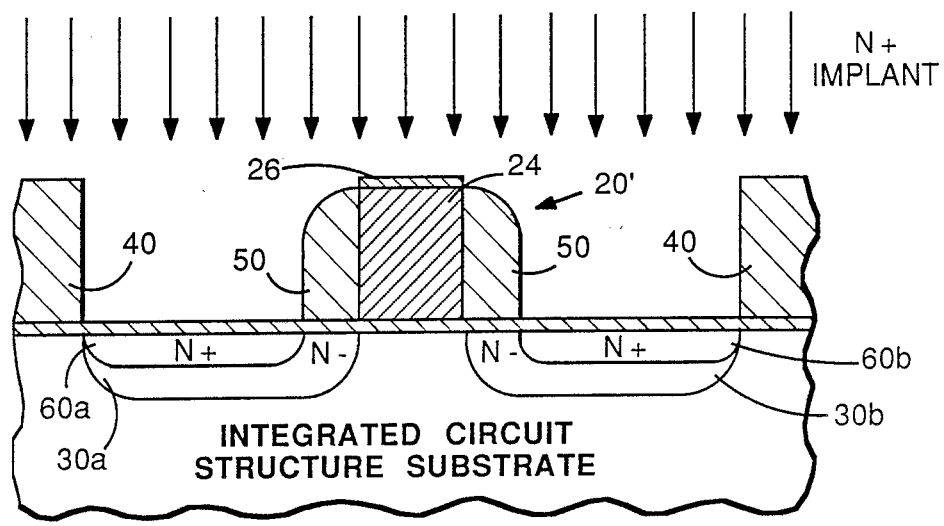
FIG. 4 is a fragmentary vertical cross-sectional view of the structure of FIG. 3 showing N+ source and drain regions being formed in the substrate adjacent the previously formed N— LDD regions by doping the substrate with an N+ dopant using the previously deposited polysilicon on the sidewalls of the gate electrode as a mask over the previously formed LDD regions.

The result, as shown in FIG. 4, is an NMOS structure wherein N− LDD regions 30a and 30b are formed in substrate 10 below the sidewall segments 50 of polysilicon gate electrode 20' and self-aligned N+ source and drain regions 60a and 60b are formed in substrate 10 adjacent to LDD regions 30a and 30b.

It will also be seen from FIG. 4 that there is no offset between the edge of gate electrode 20' and source and drain regions 60a and 60b due to the selective polysilicon deposition 50 on the sidewalls of original polysilicon gate segment 24 after formation of LDD regions 30a and 30b.

The NMOS structure may then be conventionally processed, for example, by applying a layer of insulating oxide over the structure, opening vias to the source, gate, and drain electrodes, forming a metal layer over the structure which fills the vias and then patterning the metal layer to form the metal contacts to each electrode.

It should be noted that while the invention has been described with respect to the construction of LDD regions in NMOS devices, in view of the recognized need for the formation of such LDD regions in NMOS structures, the method is equally applicable to the formation of such LDD regions in PMOS structures, if desired, using P− and P+ dopants in substitution for the N− and N+ dopants.

Thus, the invention provides an improved method of forming LDD regions in a semiconductor wafer substrate during the construction of MOS devices wherein the subsequently formed source and drain regions are not offset from the edge of the polysilicon gate electrode due to the widening of the gate electrode, after formation of the LDD regions, by selective deposition of further polysilicon on the sidewalls of the original polysilicon gate electrode, to effectively widen the polysilicon gate electrode. Unlike the prior art T-shaped polysilicon gate electrodes, the structure of the invention is more easily formed, since it is not necessary to attempt to control the thickness of T-shaped segments of a polysilicon gate electrode, as in the prior art constructions, yet the invention provides source and drain regions in the substrate which are self-aligned with the edge of the polysilicon gate electrode.

Having thus described the invention, what is claimed is:

1. An improved method for forming one or more LDD regions in an integrated circuit structure wherein there is no offset between the gate electrode and the source and drain regions in the resulting structure which comprises:
    (a) forming a polysilicon gate electrode over a gate oxide layer previously formed on a semiconductor wafer substrate;
    (b) doping said substrate to form one or more LDD regions;
    (c) selectively depositing polysilicon on the polysilicon sidewalls of said polysilicon gate electrode; and
    (d) doping said substrate to form source and drain regions in said substrate using said selectively deposited polysilicon as a mask over said LDD regions previously formed in said substrate.

2. The method of claim 1 wherein said step of forming said polysilicon gate electrode further comprises forming an oxide layer over the top surface of a polysilicon layer prior to patterning said layers to form said polysilicon gate electrode.

3. The method of claim 2 wherein said step of doping said substrate to form said one or more LDD regions further comprises implanting said substrate with a N− dopant.

4. The method of claim 2 wherein said step of doping said substrate to form said one or more LDD regions further comprises implanting said substrate with phosphorus at a dopant concentration of from about $10^{13}$ to about $10^{14}$ atoms/cm to form one or more N− LDD regions in said substrate.

5. The method of claim 3 including the further step of annealing said semiconductor wafer substrate after said step of implanting said N− dopant to diffuse said N− dopant into said substrate.

6. The method of claim 3 including the further step of annealing said semiconductor wafer substrate, after said step of implanting said N− dopant, at a temperature of from about 850° C. to about 950° C. for a period of from about 15 minutes to about 30 minutes to diffuse said N− dopant into said substrate.

7. The method of claim 3 including the further step of annealing said semiconductor wafer substrate, after said step of implanting said N− dopant, at a temperature of from about 950° C. to about 1050° C. for a period of from about 10 seconds to about 30 seconds to diffuse said N− dopant into said substrate by a rapid anneal process.

8. The method of claim 3 wherein said step of doping said substrate to form said source and drain regions in said substrate further comprises implanting said substrate with an N+ dopant.

9. The method of claim 8 including the further step of annealing said semiconductor wafer substrate, after said step of implanting said N+ dopant, to diffuse said N− dopant and said N+ dopant into said substrate.

10. The method of claim 1 wherein said step of selectively forming said polysilicon on the sidewalls of said polysilicon gate electrode further comprises depositing polysilicon on said polysilicon gate electrode sidewalls in a CVD chamber at a pressure of from about 10 Torr to about 760 Torr, using a halogen-containing source of silicon which is flowed into the CVD vacuum chamber at a flow rate of from about 100 sccm to about 200 sccm.

11. The method of claim 10 wherein said polysilicon is selectively deposited on the sidewalls of said polysilicon gate electrode until a polysilicon deposit having a lateral thickness or width of from about 0.05 micrometers to about 0.2 micrometers has deposited on the polysilicon sidewalls of said gate electrode.

12. The method of claim 10 wherein said halogen-containing source of silicon is selected from the class consisting of $SiH_2Cl_2$, $SiHCl_3$, and $SiCl_4$.

13. An improved method for forming one or more LDD regions in an integrated circuit structure wherein there is no offset between the gate electrode and the source and drain regions in the resulting structure which comprises:
   (a) forming a gate oxide layer on a semiconductor wafer substrate;
   (b) forming a polysilicon layer over said gate oxide layer;
   (c) forming a further oxide layer over said polysilicon layer;
   (d) patterning said further oxide layer and said polysilicon layer to form a polysilicon gate electrode on said wafer substrate;
   (e) doping said substrate with an N− dopant at a dopant concentration of from about $10^{13}$ to about $10^{14}$ atoms/cm$^2$ to form one or more N−LDD regions in said substrate;
   (f) selectively depositing polysilicon on the polysilicon sidewalls of said gate electrode in a CVD chamber at a pressure of from about 10 Torr to about 760 Torr, using a halogen-containing source of silicon which is flowed into the CVD chamber at a flow rate of from about 100 sccm to about 200 sccm;
   (g) doping said substrate with an N+ dopant at a dopant concentration of from about $2 \times 10^{15}$ to about $5 \times 10^{15}$ atoms/cm$^2$ to form N+ source and drain regions in said substrate using said selectively deposited polysilicon as a mask over said LDD regions previously formed in said substrate; and
   (h) annealing said implanted substrate at a temperature of from about 850° C. to about 950° C. for a period of from about 15 minutes to about 30 minutes or at a temperature of from about 950° C. to about 1050° C. for a period of from about 10 seconds to about 30 seconds to diffuse said dopants into said substrate.

14. The method of claim 13 wherein said step of doping said substrate to form said one or more N-LDD regions in said substrate further comprises implanting said substrate with phosphorus to form said one or more N− LDD regions in said substrate.

15. The method of claim 13 wherein said step of doping said substrate to form said N+ source and drain regions in said substrate further comprises implanting said substrate with arsenic to form said one or more N+ source and drain regions in said substrate.

16. The method of claim 13 wherein said polysilicon is selectively deposited on the sidewalls of said polysilicon gate electrode until a polysilicon deposit having a lateral thickness or width of from about 0.05 micrometers to about 0.2 micrometers has deposited on the polysilicon sidewalls of said gate electrode.

17. The method of claim 13 wherein said halogen-containing source of silicon is selected from the class consisting of $SiH_2Cl_2$, $SiHCl_3$, and $SiCl_4$.

18. An improved method for forming one or more LDD regions in an integrated circuit structure wherein there is no offset between the gate electrode and the source and drain regions in the resulting structure which comprises:
   (a) forming a gate oxide layer on a semiconductor wafer substrate;
   (b) forming a polysilicon layer over said gate oxide layer;
   (c) forming a further oxide layer over said polysilicon layer;
   (d) patterning said further oxide layer and said polysilicon layer to form a polysilicon gate electrode on said wafer substrate;
   (e) implanting said substrate with phosphorus at a dopant concentration of from about $10^{13}$ to about $10^{14}$ atoms/cm$^2$ and an energy level of from about 60 KeV to about 80 KeV to form one or more N− LDD regions in said substrate;
   (f) selectively depositing polysilicon on the polysilicon sidewalls of said gate electrode in a CVD chamber at a pressure of from about 10 Torr to about 760 Torr, using a halogen-containing source of silicon selected from the class consisting of $SiH_2Cl_2$, $SiHCl_3$, and $SiCl_4$ which is flowed into the CVD vacuum chamber at a flow rate of from about 100 sccm to about 200 sccm until a polysilicon deposit having a lateral thickness or width of from about 0.05 micrometers to about 0.2 micrometers has deposited on the polysilicon sidewalls of said gate electrode;
   (g) implanting said substrate with arsenic at a dopant concentration of from about $2 \times 10^{15}$ to about $5 \times 10^{15}$ atoms/cm$^2$ and an energy level of from about 60 KeV to about 80 KeV to form N+ source and drain regions in said substrate using said selectively deposited polysilicon as a mask over said LDD regions previously formed in said substrate; and
   (h) annealing said implanted substrate at a temperature of from about 850° C. to about 950° C. for a period of from about 15 minutes to about 30 minutes or at a temperature of from about 950° C. to about 1050° C. for a period of from about 10 seconds to about 30 seconds to diffuse said dopants into said substrate.

19. An improved MOS integrated circuit structure characterized by the formation of one or more N-LDD regions in a semiconductor wafer substrate beneath a polysilicon gate electrode and source and drain regions in said substrate self-aligned to the edges of said gate electrode, wherein a polysilicon gate electrode is first formed over said substrate, said substrate is doped with an N− dopant to form said one or more LDD regions, further polysilicon is selectively deposited only on the polysilicon sidewalls of said gate electrode, and said substrate is then doped with an N+ dopant to form source and drain regions self-aligned to the edge of said polysilicon gate electrode using said selectively deposited polysilicon as a mask over said one or more N− LDD regions.

* * * * *